(12) United States Patent
Yang et al.

(10) Patent No.: US 9,165,994 B1
(45) Date of Patent: Oct. 20, 2015

(54) ORGANIC LIGHT EMITTING DISPLAY

(71) Applicant: LG Display Co., Ltd., Seoul (KR)

(72) Inventors: Heejung Yang, Yangju-si (KR);
Gyuwon Han, Yeoju-gun (KR);
Wonjoon Ho, Jeonju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/473,545

(22) Filed: Aug. 29, 2014

(30) Foreign Application Priority Data

Mar. 26, 2014 (KR) .................. 10-2014-0035329

(51) Int. Cl.
*H01L 29/22* (2006.01)
*H01L 27/32* (2006.01)
*H01L 27/12* (2006.01)
*H01L 51/52* (2006.01)

(52) U.S. Cl.
CPC .......... *H01L 27/3272* (2013.01); *H01L 27/124* (2013.01); *H01L 51/5271* (2013.01); *H01L 51/5284* (2013.01)

(58) Field of Classification Search
CPC .............. H01L 27/124; H01L 51/5271; H01L 51/5284
USPC ......................................... 257/40, 59, 72, 98
See application file for complete search history.

(56) References Cited

U.S. PATENT DOCUMENTS

| 7,795,807 B2 * | 9/2010 | Li ................................. 313/506 |
| 2012/0097930 A1 * | 4/2012 | Park et al. ..................... 257/40 |
| 2013/0155860 A1 * | 6/2013 | Choi et al. ................... 370/235 |

\* cited by examiner

*Primary Examiner* — Matthew E Warren
(74) *Attorney, Agent, or Firm* — Fenwick & West LLP

(57) ABSTRACT

An organic light emitting display includes a display panel including subpixels and a driver for driving the display panel. The display panel includes a reflection reduction layer, which is formed on an internal surface or an external surface of a substrate and is positioned correspondingly to a non-opening area defined in the substrate.

19 Claims, 11 Drawing Sheets

(a)

(b)

# ORGANIC LIGHT EMITTING DISPLAY

CROSS REFERENCE TO RELATED APPLICATION

This application claims the benefit of Korean Patent Application No. 10-2014-0035329 filed on Mar. 26, 2014, which is incorporated herein by reference for all purposes as if fully set forth herein.

BACKGROUND OF THE INVENTION

1. Field of the Invention

Embodiments of the invention relate to an organic light emitting display.

2. Discussion of the Related Art

An organic light emitting element used in an organic light emitting display is a self-emitting element having a light emitting layer between two electrodes. The organic light emitting element receives electrons and holes from a cathode serving as an electron injection electrode and an anode serving as a hole injection electrode and injects the electrons and the holes into the light emitting layer. The injected electrons and holes are combined to form an exciton. The organic light emitting element emits light when the exciton drops from an excited state to a ground state.

The organic light emitting display forms a display panel using the organic light emitting element. The display panel may be classified into a top emission type, a bottom emission type, and a dual emission type depending on an emission direction of light. Further, the display panel may be classified into a passive matrix type and an active matrix type depending on a driving method.

The display quality (visibility, luminance, etc.) of the organic light emitting display may be reduced due to the incidence of ambient light. Hence, when the display panel of the organic light emitting display was manufactured in a related art, the related art limited incidence of the ambient light by attaching a circular polarizer to an external surface (or a display surface) of the display panel.

However, when the circular polarizer was attached to the external surface of the display panel in the related art, a luminance of the display panel was reduced to about one half. Further, an increase in the manufacturing cost was caused by the circular polarizer.

SUMMARY OF THE INVENTION

In one aspect, there is an organic light emitting display comprising a display panel including subpixels and a driver configured to drive the display panel, wherein the display panel includes a reflection reduction layer, which is formed on an internal surface or an external surface of a substrate and is positioned correspondingly to a non-opening area defined in the substrate.

In one embodiment an organic light emitting display comprises a substrate and a plurality of sub-pixels. Each sub-pixel has a first area for light emission; a second area including a transistor electrode, the second area being different than the first area; and a reflection reduction layer in the second area but not the first area. The reflection reduction layer is located between the transistor electrode and the substrate and has lower light reflectability than a material of the transistor electrode.

In one embodiment, the second area includes a transistor drain electrode, a transistor source electrode, a transistor gate electrode and a data line, and the reflection reduction layer entirely covers the second area. In one embodiment, the reflection reduction layer is formed directly on an internal surface of the substrate. In one embodiment, the reflection reduction layer and the transistor electrode are patterned together into a same shape. In one embodiment, the sub-pixel includes a semiconductor layer and light shielding layer to shield the semiconductor layer from light, and the reflection reduction layer is formed on a surface of the light shielding layer.

In another embodiment, the second area includes a data line, and the reflection reduction layer is located between the data line and the substrate and has lower light reflectability than a material of the data line.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF EMBODIMENTS

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention.

Exemplary embodiments of the invention will be described with reference to FIGS. 1 to 14.

Figure 1:
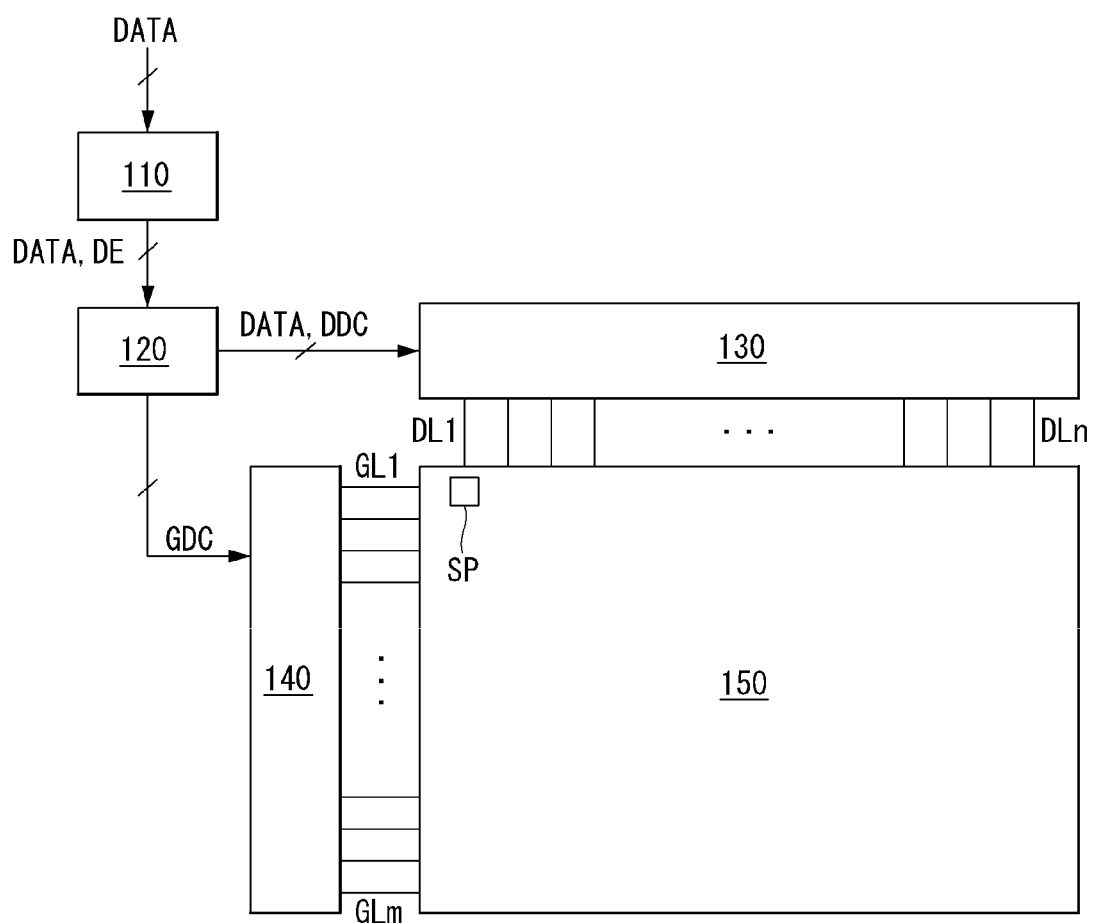
FIG. 1 schematically shows configuration of an organic light emitting display according to an exemplary embodiment of the invention.
Figure 2:
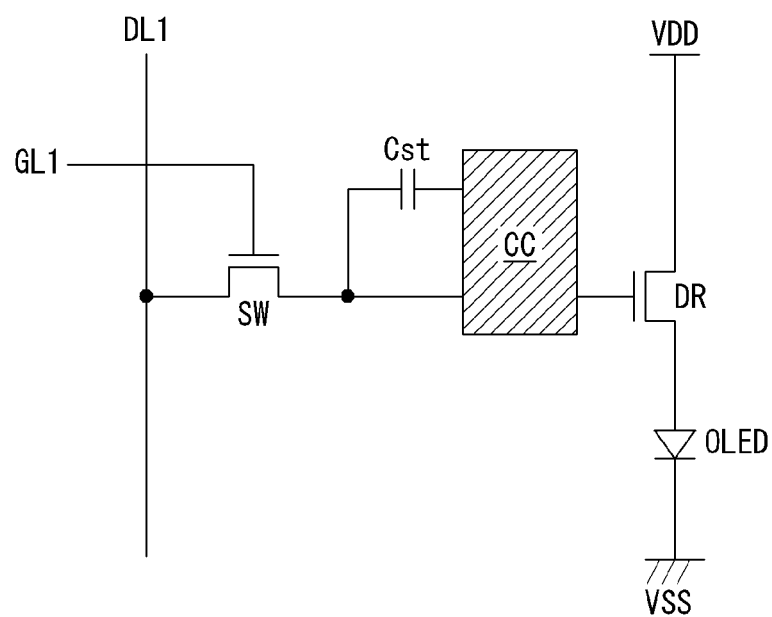
FIG. 2 shows an example of circuit configuration of a subpixel.
Figure 3:
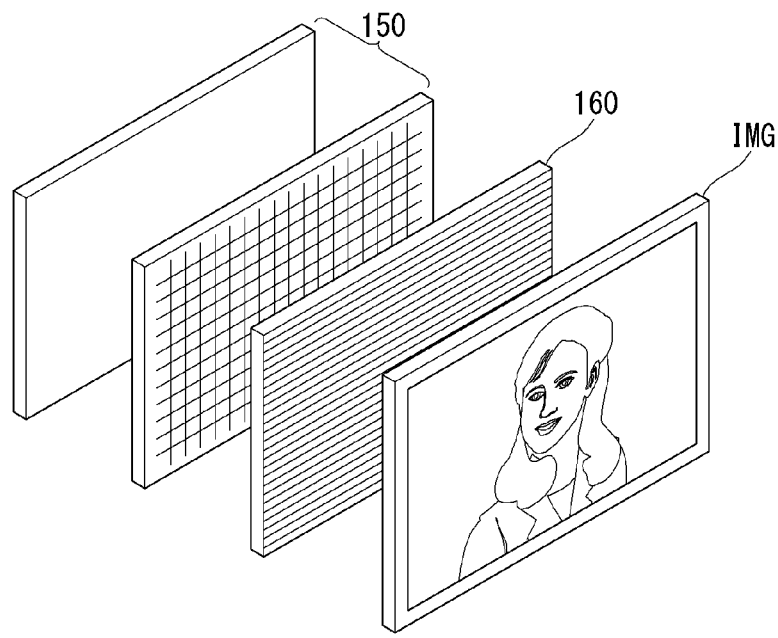
FIG. 3 illustrates a comparison between a related art organic light emitting display and an organic light emitting display according to an exemplary embodiment of the invention.
Figure 3:
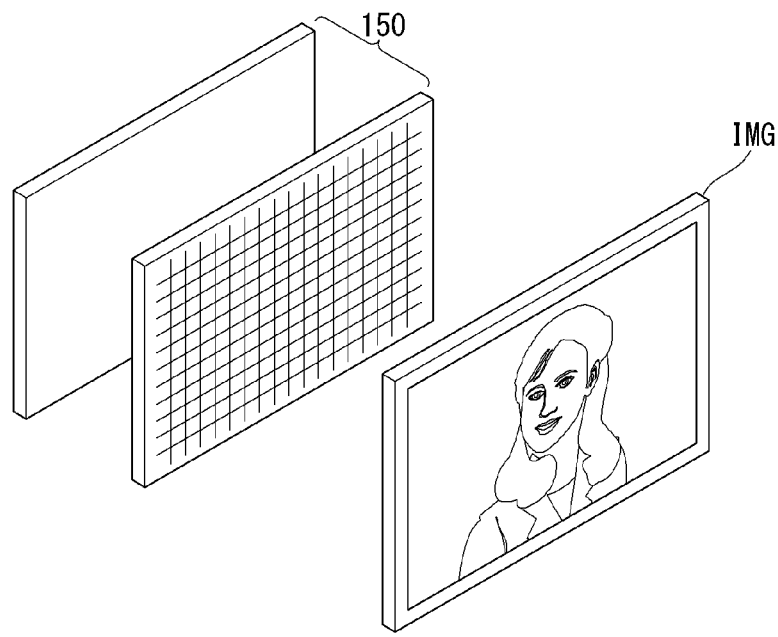

FIG. 1 schematically shows configuration of an organic light emitting display according to an exemplary embodiment of the invention. FIG. 2 shows an example of circuit configuration of a subpixel. FIG. 3 illustrates a comparison between a related art organic light emitting display and an organic light emitting display according to an exemplary embodiment of the invention.

As shown in FIG. 1, an organic light emitting display according to an exemplary embodiment of the invention includes an image processing unit 110, a timing controller 120, a data driver 130, a gate driver 140, and a display panel 150.

The image processing unit 110 outputs a data signal DATA received from the outside, a data enable signal DE, and the like. The image processing unit 110 may output at least one of a vertical sync signal, a horizontal sync signal, and a clock signal, in addition to the data enable signal DE. However, the signals are not shown and are omitted in the embodiment of the invention for the sake of brevity and ease of reading.

The timing controller 120 receives the data signal DATA along with the data enable signal DE or a driving signal including the vertical sync signal, the horizontal sync signal, and the clock signal from the image processing unit 110. The timing controller 120 outputs a gate timing control signal GDC for controlling timing of the gate driver 140 and a data timing control signal DDC for controlling timing of the data driver 130 based on the received signals.

The data driver 130 samples and latches the data signal DATA received from the timing controller 120 in response to the data timing control signal DDC received from the timing controller 120, converts the latched data signal DATA into a gamma reference voltage, and outputs the gamma reference voltage. The data driver 130 outputs the data signal DATA through data lines DL1 to DLn. The data driver 130 is configured as an integrated circuit (IC) type.

The gate driver 140 outputs a gate signal while shifting a level of a gate voltage in response to the gate timing control signal GDC received from the timing controller 120. The gate driver 140 outputs the gate signal through gate lines GL1 to GLm. The gate driver 140 is configured as an integrated circuit (IC) type or is formed on the display panel in a gate in panel (GIP) type.

The display panel 150 displays an image corresponding to the data signal DATA and the gate signal respectively supplied from the data driver 130 and the gate driver 140. The display panel 150 includes subpixels SP displaying the image.

The subpixel may be configured as a top emission type, a bottom emission type, or a dual emission type depending on its structure. The subpixels SP may include red subpixels, green subpixels, and blue subpixels, or may include white subpixels, red subpixels, green subpixels, and blue subpixels. The subpixels SP may have one or more emission areas depending on their emission characteristics.

As shown in FIG. 2, each subpixel SP includes a switching transistor SW, a driving transistor DR, a capacitor Cst, a compensation circuit CC, and an organic light emitting diode OLED. The organic light emitting diode OLED operates, so that it emits light depending on a driving current formed by the driving transistor DR.

The switching transistor SW performs a switching operation, so that the data signal received through a first data line DL1 is stored in the capacitor Cst as a data voltage in response to the gate signal received through a first gate line GL1. The driving transistor DR operates so that the driving current flows between a first power line VDD and a second power line GND depending on the data voltage stored in the capacitor Cst. The compensation circuit CC is a circuit for compensating for a threshold voltage of the driving transistor DR.

The compensation circuit CC includes at least one transistor and at least one capacitor. The compensation circuit CC may have various configurations depending on a compensation method, and a further description thereof may be briefly made or may be entirely omitted.

FIG. 2 shows that the compensation circuit CC is included in one subpixel. However, when the subject of compensation (for example, the data driver 130) is positioned outside the subpixel, the compensation circuit CC may be omitted. The subpixel generally has a 2T (transistor) 1C (capacitor) structure including the switching transistor SW, the driving transistor DR, the capacitor Cst, and the organic light emitting diode OLED. If the compensation circuit CC is added, the subpixel may have a 3T1C structure, 4T2C structure, 5T2C structure, etc.

The display quality (visibility, luminance, etc.) of the organic light emitting display may be reduced due to the incidence of ambient light.

As shown in (a) of FIG. 3, when a display panel 150 of an organic light emitting display is manufactured in a related art, the related art limits reflection characteristic of ambient light by attaching a circular polarizer 160 for improving the display quality of an image IMG to the display panel 150.

As shown in (b) of FIG. 3, when the display panel 150 of the organic light emitting display is manufactured in the embodiment of the invention, the embodiment of the invention uses a reflection reduction layer instead of the circular polarizer for improving the display quality of the image IMG.

More specifically, the embodiment of the invention limits reflection characteristic of ambient light using the reflection reduction layer included in the display panel 150. The reflection reduction layer may be formed inside or outside the display panel 150. The reflection reduction layer may be formed of a binary compound such as metal oxide, ITO, IZO, IGZO, CuOx, and AlOx, alloy oxide including the binary compound, and alloy nitride including the binary compound. It is preferable, but not required, that the reflection reduction layer is formed inside the display panel 150 for convenience of the manufacturing process.

A related art method and a method according to the embodiment of the invention for solving the problem resulting from the incidence of ambient light are described below through the comparison between them.

Figure 4:
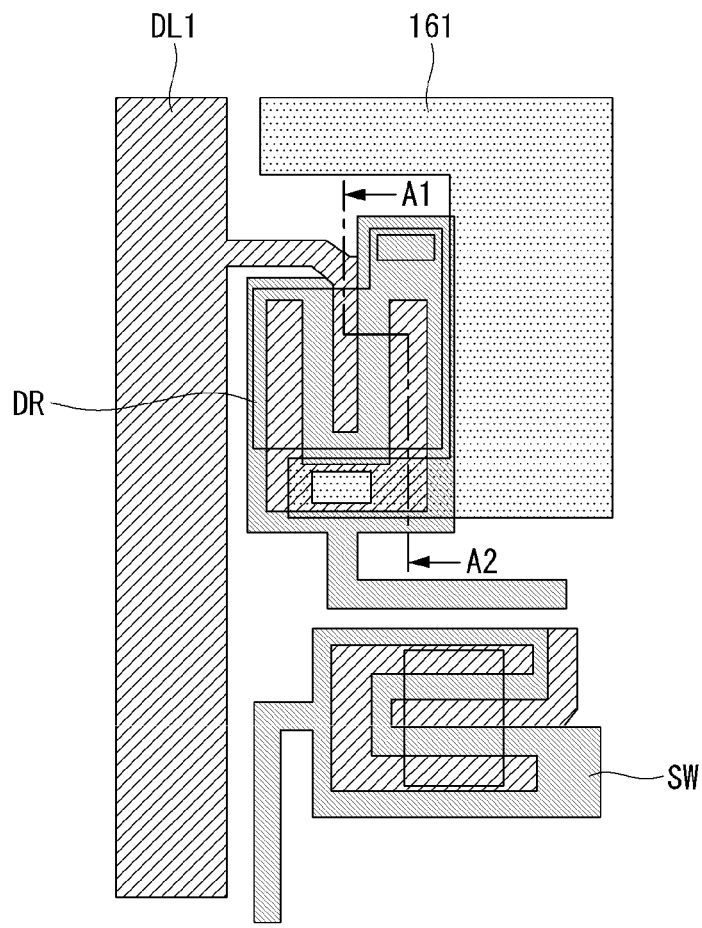
FIGS. 4 and 5 are a plane view and a cross-sectional view of a subpixel of a related art organic light emitting display.
Figure 4:
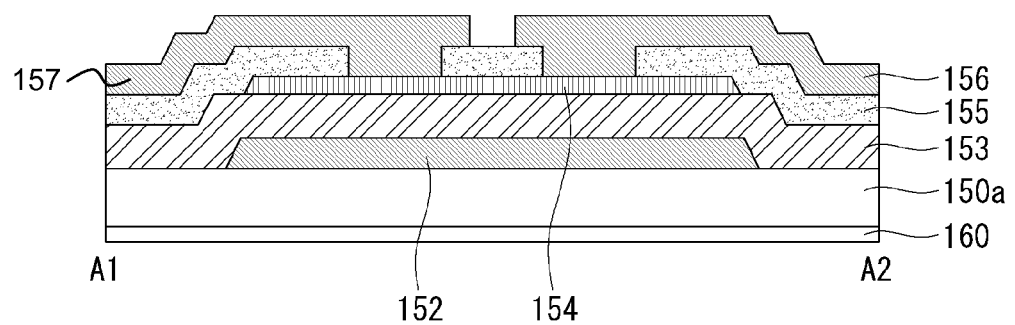
Figure 5:
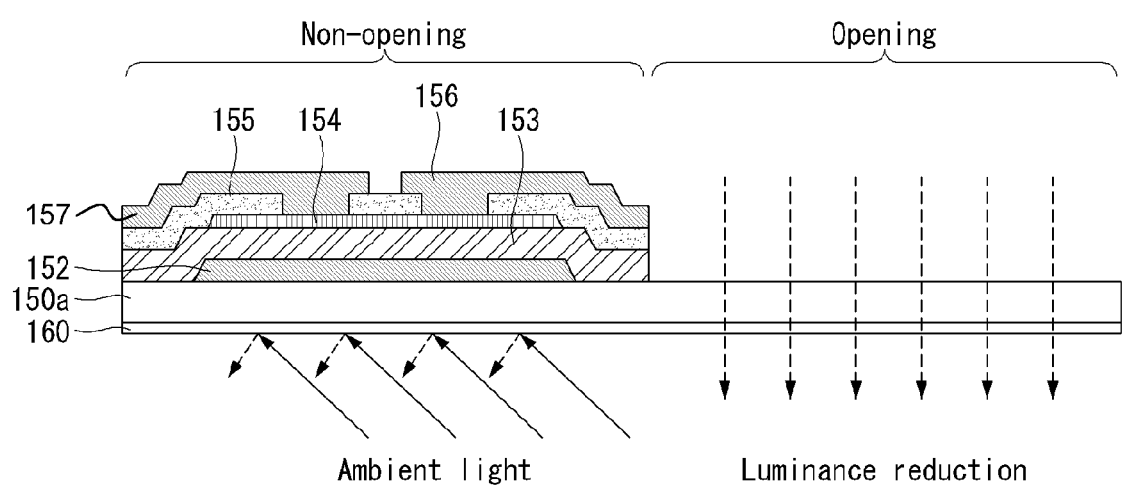
Figure 6:
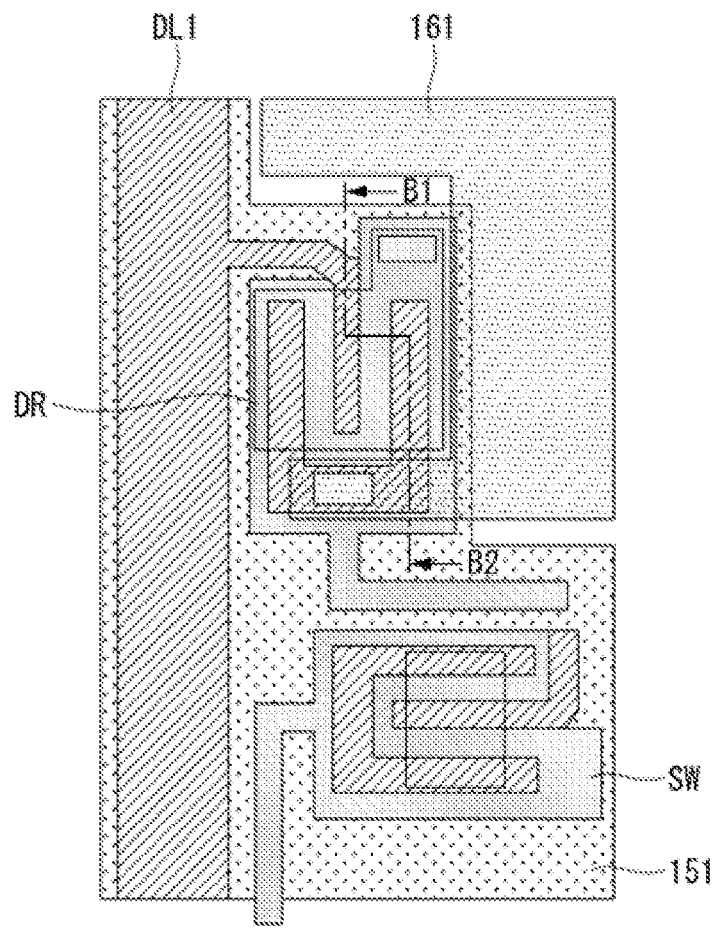
FIGS. 6 and 7 are a plane view and a cross-sectional view of a subpixel of an organic light emitting display according to an exemplary embodiment of the invention.
Figure 6:
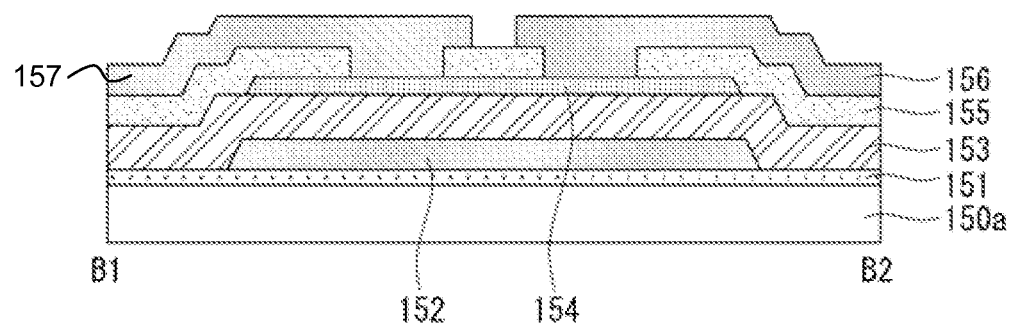
Figure 7:
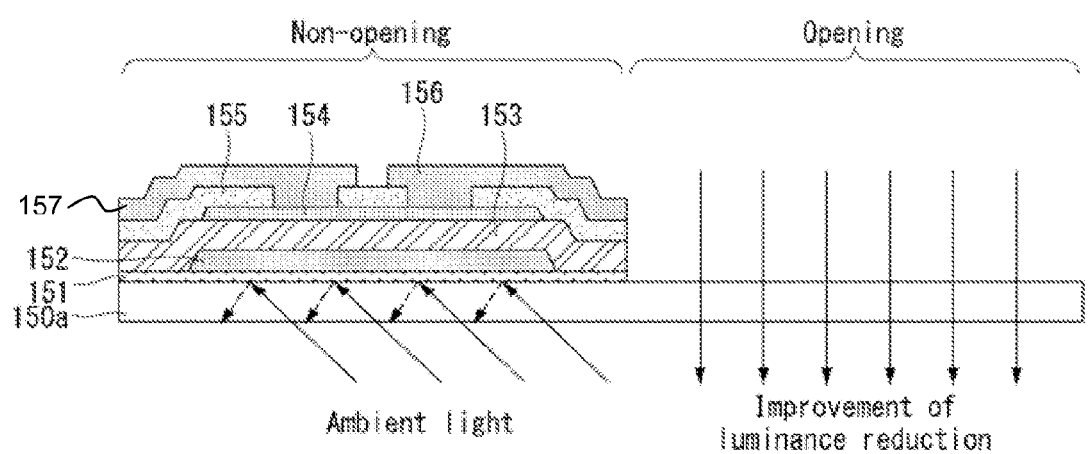
Figure 8:
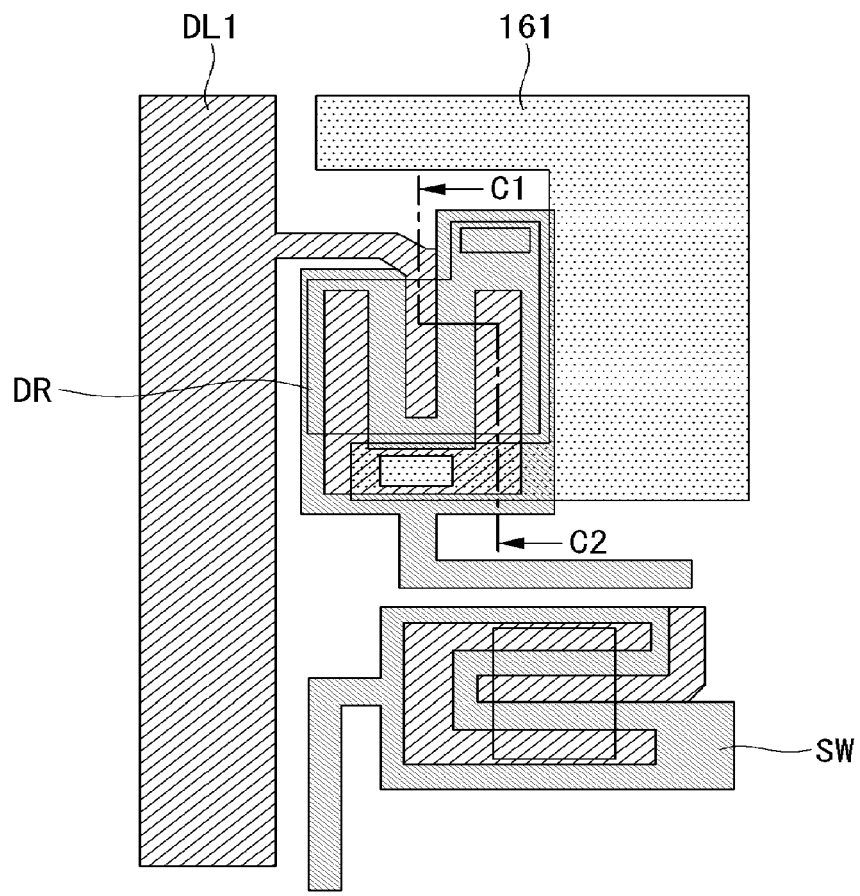
FIGS. 8 and 9 are a plane view and a cross-sectional view of a subpixel of an organic light emitting display according to another exemplary embodiment of the invention.
Figure 8:
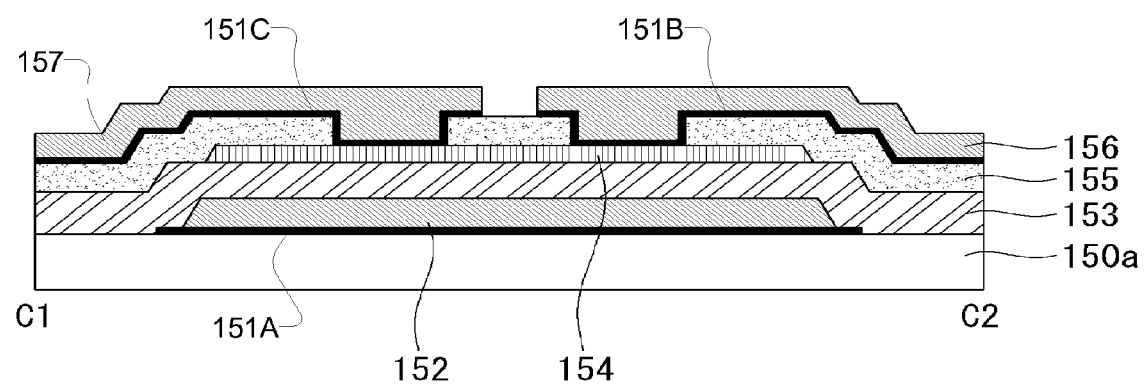
Figure 9:
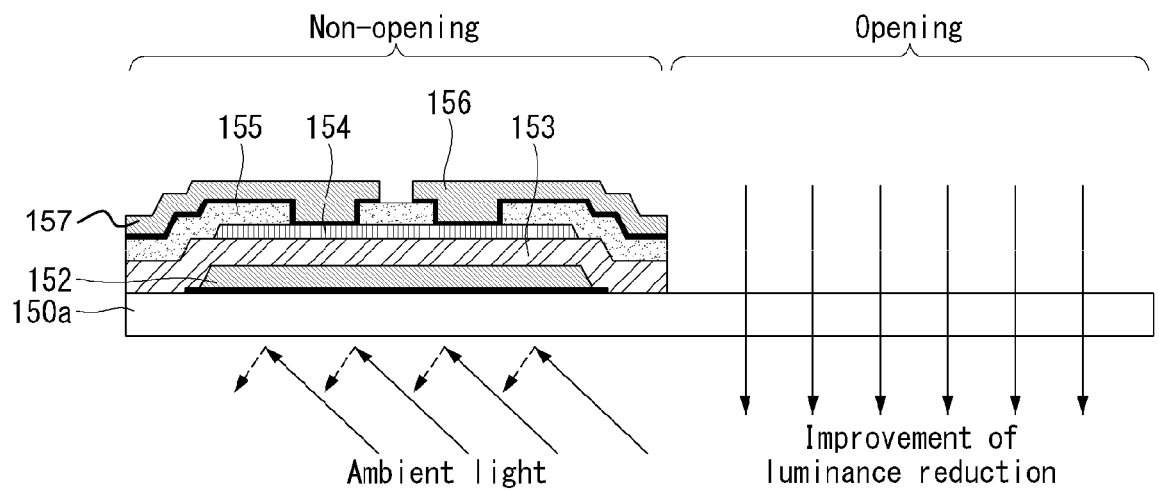

FIGS. 4 and 5 are a plane view and a cross-sectional view of a subpixel of a related art organic light emitting display. FIGS. 6 and 7 are a plane view and a cross-sectional view of the subpixel of the organic light emitting display according to the embodiment of the invention. FIGS. 8 and 9 are a plane view and a cross-sectional view of a subpixel of an organic light emitting display according to another exemplary embodiment of the invention.

As shown in FIGS. 4 and 5, the subpixel of the related art organic light emitting display is defined by a data line DL1, a gate line, etc. The subpixel includes an opening area, in which a lower electrode 161, etc. are formed, and a non-opening area, in which the data line DL1, the gate line, a switching transistor SW, a capacitor (not shown), a driving transistor DR, etc. are formed.

The opening area corresponds to an emission area, in which light is emitted, and the non-opening area corresponds to a non-emission area, in which light is not emitted. Because the electrodes or the lines formed in the non-opening area are generally used to transfer various signals or electric power, they have more excellent electric characteristic, lower resistance, and higher reflectance than the electrodes or the lines formed in the opening area.

More specifically, the related art uses the simple method for attaching the circular polarizer 160 to an external surface (or a display surface) of a lower substrate 150a of the display panel 150, so as to limit the reflection characteristic of the ambient light on the entire display surface of the display panel 150. When the circular polarizer 160 is attached to the external surface of the display panel 150 as in the related art, the circular polarizer 160 reduces a reflectance of the non-opening area and thus can improve the display quality of the image IMG. However, it is difficult to prevent a luminance reduction in the opening area.

As shown in FIGS. 6 and 7, the subpixel of the organic light emitting display according to the embodiment of the invention is defined by a data line DL1, a gate line, etc. The subpixel includes an opening area, in which a lower electrode 161, etc. are formed, and a non-opening area, in which the data line DL1, the gate line, a switching transistor SW, a driving transistor DR, etc. are formed.

The opening area corresponds to an emission area, in which light is emitted, and the non-opening area corresponds to a non-emission area, in which light is not emitted. Because the electrodes or the lines formed in the non-opening area are generally used to transfer various signals or electric power, they have more excellent electric characteristic, lower resistance, and higher reflectance than the electrodes or the lines formed in the opening area.

In the embodiment of the invention, a reflection reduction layer 151 is formed directly on an internal surface of a lower substrate 150a of the display panel 150 and is patterned correspondingly to the non-opening area of the display panel 150. The reflection reduction layer 151 is described in detail below based on a cross section of the driving transistor DR.

More specifically, the reflection reduction layer 151 is formed on the entire internal surface of the lower substrate 150a and is patterned such that the reflection reduction layer 151 only covers the non-opening area of the display panel 150. In this instance, the reflection reduction layer 151 includes at least two layers. Next, a gate electrode 152 is formed on the reflection reduction layer 151 and is patterned. Next, a first insulating layer 153 is formed on the internal surface of the lower substrate 150a and covers the gate electrode 152. Next, a semiconductor layer 154 is formed on the first insulating layer 153 and is patterned. Next, an etch stopper layer 155 is formed on the semiconductor layer 154 and is patterned to expose a source region and a drain region. A source electrode 156 and a drain electrode 157 are formed on the etch stopper layer 155 and are patterned.

The gate electrode 152, the source electrode 156, and the drain electrode 157 may be formed of a metal material such as Cu, Al, Au, Ag, Ti, Mo, W, Ta, and at least one alloy containing the same. An element of the alloy may be selected among Ca, Mg, Zn, Mn, Ti, Mo, Ni, Nd, Zr, Cd, Au, Ag, Co, Fe, Rh, In, Ta, Hf, W, and Cr. The semiconductor layer 154 may be formed of Si-based material, oxide-based material, graphene-based material containing carbon nanotube (CNT), nitride-based material, and/or organic semiconductor-based material.

The reflection reduction layer 151 is made from a material that absorbs light and may appear black in color. Importantly, the reflection reduction layer 151 is made from a material that absorbs more light than the metal components within the non-opening area (e.g., gate electrode 152, source electrode 156, drain electrode 157, etc.). This results in a reflection reduction layer 151 having lower light reflectability than the metal components within the non-opening area.

When the reflection reduction layer 151 is formed on the internal surface of the lower substrate 150a as in the embodiment of the invention, the reflection reduction layer 151 entirely covers the non-opening area to reduce reflections. The reflection reduction layer 151 does not cover the opening area. Therefore, the circular polarizer is omitted in the embodiment of the invention. It is preferable, but not required, that an area occupied by the reflection reduction layer 151 when patterning the reflection reduction layer 151 is larger than the entire area occupied by the electrodes or the lines positioned in the non-opening area.

The reason is because a reflectance of the ambient light incident from the upper, lower, left, and right sides of the organic light emitting display may be considered. Therefore, the area occupied by the reflection reduction layer 151 may be the entire area of the subpixel except for the opening area from the subpixel. However, the embodiment of the invention is not limited thereto. For example, the area occupied by the reflection reduction layer 151 may be equal to the entire area occupied by the electrodes or the lines positioned in the non-opening area.

Accordingly, the embodiment of the invention forms the reflection reduction layer 151 on the internal surface of the lower substrate 150a corresponding to the non-opening area, thereby limiting reflection of ambient light in the non-opening area and also preventing luminance reduction in the opening area.

As shown in FIGS. 8 and 9, the subpixel of the organic light emitting display according to another embodiment of the invention is defined by a data line DL1, a gate line, etc. The subpixel includes an opening area, in which a lower electrode 161, etc. are formed, and a non-opening area, in which the data line DL1, the gate line, a switching transistor SW, a capacitor (not shown), a driving transistor DR, etc. are formed. The opening area is different and separate from the non-opening area.

The opening area corresponds to an emission area, in which light is emitted, and the non-opening area corresponds to a non-emission area, in which light is not emitted. Because the electrodes or the lines formed in the non-opening area are generally used to transfer various signals or electric power, they have better electric characteristics, lower resistance, and higher reflectance than the electrodes or the lines formed in the opening area.

The embodiment of the invention is configured so that a reflection reduction layer is included in an electrode material when the data line DL1, the gate line, the switching transistor SW, the driving transistor DR, a gate electrode, a source electrode, and a drain electrode are formed in the non-opening area. The reflection reduction layer is described in detail below based by reference to a cross section of the driving transistor DR. Although formed with the electrodes, the reflection reduction layer may also be considered a separate layer than is patterned into the same shape as the electrodes.

More specifically, a gate electrode 152 including a reflection reduction layer 151A is formed on an internal surface of a lower substrate 150a and is patterned. Next, a first insulating layer 153 is formed on the internal surface of the lower substrate 150a and covers the gate electrode 152. Next, a semiconductor layer 154 is formed on the first insulating layer 153 and is patterned. Next, an etch stopper layer 155 is formed on the semiconductor layer 154 and is patterned to expose a source region and a drain region. Next, a source electrode 156 including the reflection reduction layer 151B and a drain electrode 157 including the reflection reduction layer 151C are formed on the etch stopper layer 155 and are patterned.

When the reflection reduction layer is included in the electrode material in the formation of the data line DL1, the gate line, the switching transistor SW, and the driving transistor DR as in the embodiment of the invention, the reflection reduction layer covers reflective components in the non-opening area but does not cover the opening area. Therefore, the circular polarizer is omitted in the embodiment of the invention.

When the electrode material is configured so that it includes the reflection reduction layer, the electrode material includes at least two layers. For example, the gate electrode 152 includes a non-reflection reduction layer (indicating a metal layer having a reflectance greater than the reflection reduction layer or an insulating layer capable of absorbing the ambient light) and the reflection reduction layer 151A. When the ambient light is incident through the lower substrate 150a, a first layer of the gate electrode 152 occupies the reflection reduction layer 151A, and a second layer of the gate electrode 152 occupies the non-reflection reduction layer. As described above, it is preferable, but not required, that the reflection reduction layer 151A is closer to the ambient light than the non-reflection reduction layer. The reason is because the reflectance of the reflection reduction layer 151A is less than the reflectance of the non-reflection reduction layer.

Accordingly, the embodiment of the invention includes the reflection reduction layer in structures, such as the electrodes and the lines, positioned in the non-opening area, thereby limiting the reflection of ambient light in the non-opening area and also preventing luminance reduction in the opening area.

The reflection reduction layer or the structure including the reflection reduction layer is described below.

Figure 10:
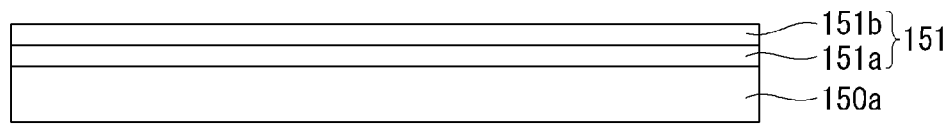
FIG. 10 shows a first example of a reflection reduction layer.
Figure 11:
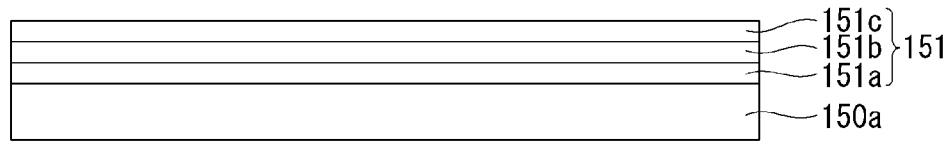
FIG. 11 shows a second example of a reflection reduction layer.
Figure 12:
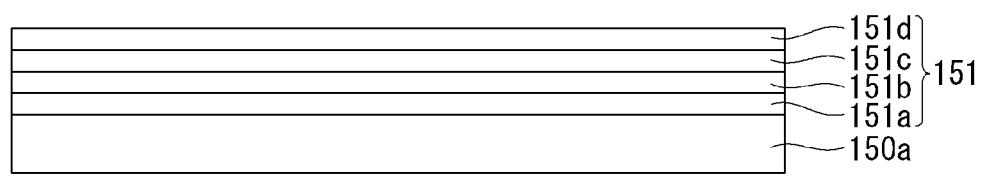
FIG. 12 shows a third example of a reflection reduction layer.
Figure 13:
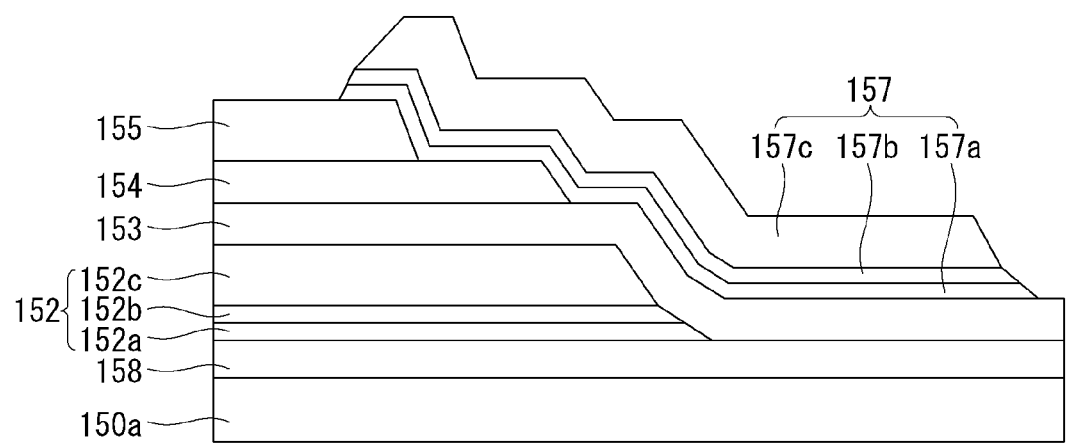
FIG. 13 shows a first example of a structure including a reflection reduction layer.
Figure 14:
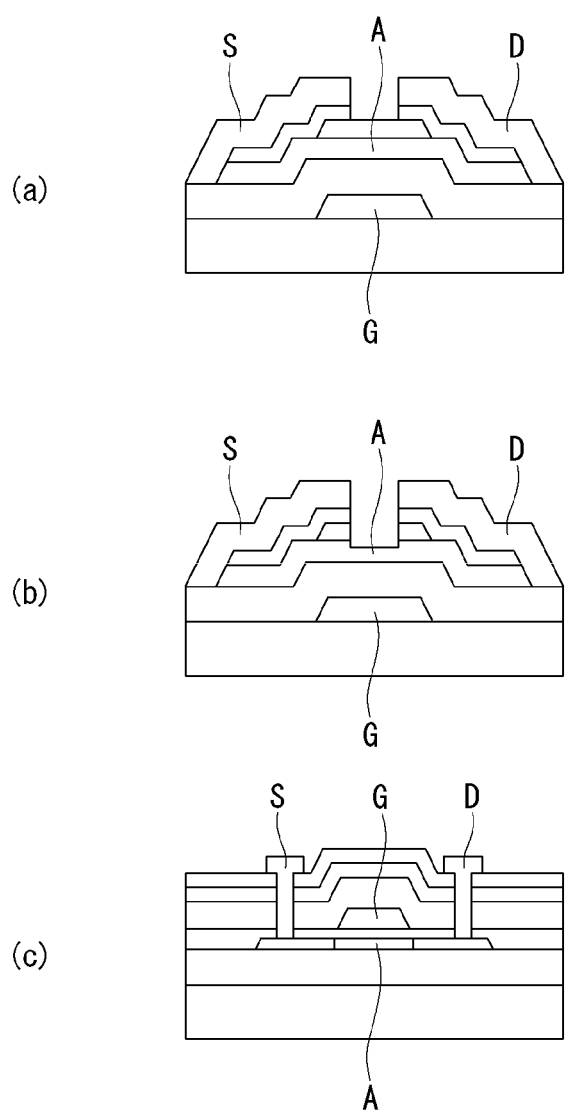
FIG. 14 shows various examples of a transistor included in a subpixel.

FIG. 10 shows a first example of the reflection reduction layer. FIG. 11 shows a second example of the reflection reduction layer. FIG. 12 shows a third example of the reflection reduction layer. FIG. 13 shows a first example of the structure including the reflection reduction layer. FIG. 14 shows various examples of the transistor included in the sub-pixel.

As shown in FIG. 10, the reflection reduction layer 151 formed on the internal surface of the lower substrate 150a may have a two-layered structure. The reflection reduction layer 151 prevents the ambient light from being incident on the lower substrate 150a and also prevents the reflection of light.

At least one of a first layer 151a and a second layer 151b of the reflection reduction layer 151 may be formed of a reflection reduction material depending on the material of the layer formed on the reflection reduction layer 151. Alternatively, both the first layer 151a and the second layer 151b may be formed of the reflection reduction material. For example, when the first layer 151a is formed of the reflection reduction material, the second layer 151b may be formed of a buffer layer.

As shown in FIG. 11, the reflection reduction layer 151 formed on the internal surface of the lower substrate 150a may have a three-layered structure. The reflection reduction layer 151 prevents the ambient light from being incident on the lower substrate 150a and also prevents the reflection of light.

At least one of a first layer 151a, a second layer 151b, and a third layer 151c of the reflection reduction layer 151 may be formed of a reflection reduction material depending on the material of the layer formed on the reflection reduction layer 151. Alternatively, all of the first to third layers 151a to 151c may be formed of the reflection reduction material. For example, when the first layer 151a and the second layer 151b are formed of the reflection reduction material, the third layer 151c may be formed of a buffer layer.

As shown in FIG. 12, the reflection reduction layer 151 formed on the internal surface of the lower substrate 150a may have a four-layered structure. The reflection reduction layer 151 prevents the reflection of ambient light.

At least one of a first layer 151a, a second layer 151b, a third layer 151c, and a fourth layer 151d of the reflection reduction layer 151 may be formed of a reflection reduction material depending on the material of the layer formed on the reflection reduction layer 151. Alternatively, all of the first to fourth layers 151a to 151d may be formed of the reflection reduction material. For example, when the second layer 151b and the third layer 151c are formed of the reflection reduction material, the first layer 151a and the fourth layer 151d may be formed of a buffer layer.

As can be seen from the above examples, the reflection reduction layer 151 may include N sub-layers, where N is an integer equal to or greater than 2. All of the N sub-layers constituting the reflection reduction layer 151 may be formed of the reflection reduction material, or at least one of the N sub-layers may be formed of the buffer layer.

As shown in FIG. 13, the gate electrode 152 and the drain electrode 157 (including the source electrode) may have a multi-layered structure including the reflection reduction layer. The gate electrode 152 and the drain electrode 157 each include the reflection reduction layer and the non-reflection reduction layer. The reflection reduction layer prevents the ambient light from being incident on the lower substrate 150a and also prevents the reflection of light. As explained, the reflection reduction layers may also be considered to be separate from the electrodes themselves.

A first layer 152a and a second layer 152b of the gate electrode 152 may be formed of the reflection reduction material. Hence, the first layer 152a and the second layer 152b corresponding to the reflection reduction layer is closer to the ambient light than a third layer 152c corresponding to the non-reflection reduction layer. A first layer 157a and a second layer 157b of the drain electrode 157 may be formed of the reflection reduction material. Hence, the first layer 157a and the second layer 157b corresponding to the reflection reduction layer is closer to the ambient light than a third layer 157c corresponding to the non-reflection reduction layer.

The gate electrode 152 and the drain electrode 157 may have the same stack structure (for example, a three-layered structure) including the reflection reduction material. Further, the gate electrode 152 and the drain electrode 157 may have different stack structures each including the reflection reduction material. For example, the gate electrode 152 may have a three-layered structure, and the drain electrode 157 may have a four-layered structure.

As can be seen from the above examples, when the gate electrode 152 and the drain electrode 157 (including the source electrode) have the multi-layered structure including the reflection reduction layer, a separate process for forming the reflection reduction layer may be omitted.

As described above with reference to FIGS. 10 to 13, the reflection reduction material contained in the reflection reduction layer or in the structures including the reflection reduction layer may be selected from metal or metal oxide such as ITO and MoTi, and the non-reflection reduction material may be selected from an insulating material such as SiOx and SiNx.

For example, in the reflection reduction layer 151 shown in FIG. 12, the first layer 151a may be formed of $SiO_2$, the second layer 151b may be formed of MoTi, the third layer 151c may be formed of ITO, and the fourth layer 151d may be formed of $SiO_2$. Further, in the gate electrode 152 shown in FIG. 13, the first layer 152a may be formed of ITO, the second layer 152b may be formed of MoTi, and the third layer 152c may be formed of Cu.

Furthermore, the layers constituting the reflection reduction layer or the structure including the reflection reduction layer may have different refractive indexes, so as to reduce the reflectance. When the reflection reduction layer or the structure including the reflection reduction layer has three or more layers, layers positioned on and under a middle layer of the three or more layers may be formed of the same material and may have the same refractive index. The reflection reduction layer or the structures including the reflection reduction layer may further include metal, metal oxide, or metal nitride (for example, MN and TiAlN) having a different refractive index. In addition, the reflection reduction layer or the structures including the reflection reduction layer may have various structures including metal layer/insulating layer/metal layer, metal layer/metal oxide layer/metal layer, and insulating layer/first metal layer/second metal layer/insulating layer.

As shown in (a) of FIG. 14, so far, the embodiment of the invention using a transistor having an inverted staggered etch stopper (ES) structure has been described. However, the transistor according to the embodiment of the invention may have an inverted staggered back channel etched (BCE) structure shown in (b) of FIG. 14 or a coplanar structure shown in (c) of FIG. 14. In FIG. 14, 'G' denotes the gate electrode, 'S' denotes the source electrode, 'D' denotes the drain electrode, and 'A' denotes the semiconductor layer.

The transistor having the coplanar structure shown in (c) of FIG. 14 may include a light shielding layer formed directly on the internal surface of the substrate. The light shielding layer shields light incident on the semiconductor layer of the transistor. The light shielding layer may have an area corresponding to an area of the semiconductor layer or may have the area larger than the area of the semiconductor layer. In this instance, the light shielding layer may be formed in a mesh shape or an island shape.

In the transistor of the coplanar structure including the light shielding layer, the reflection reduction layer may be further formed on an upper surface or a lower surface of the light shielding layer. Therefore, the reflection reduction layer may be formed as an individual layer or may be included in another layer.

As described in the various embodiments, the reflection reduction layer may be between the lower substrate 150a and at least a portion of the subpixel components (e.g., gate electrode 152, drain electrode 157, source electrode 156, data line DL1, etc.) The reflection reduction layer has lower reflective properties than a material of these components and reduces the overall amount of light reflected by the display device Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. An organic light emitting display comprising:
a substrate; and
a plurality of sub-pixels, each sub-pixel having:
a first area for light emission;
a second area including a transistor electrode having a first layer and a second layer between the first layer and the substrate, the second area being different than the first area; and
wherein the second layer of the transistor electrode is a reflection reduction layer having lower light reflectability than the first layer of the transistor electrode.

2. The organic light emitting display of claim 1, wherein the reflection reduction layer is formed directly on an internal surface of the substrate.

3. The organic light emitting display of claim 1, wherein the first layer and the second layer of the transistor electrode have a same patterned shape.

4. The organic light emitting display of claim 1, wherein the reflection reduction layer includes N layers, where N is an integer equal to or greater than 2.

5. The organic light emitting display of claim 4, wherein the reflection reduction layer includes a layer formed of a reflection reduction material and a layer formed of an insulating material.

6. The organic light emitting display of claim 4, wherein each of the reflection reduction layers is formed of reflection reduction material.

7. The organic light emitting display of claim 4, wherein the layers included in the reflection reduction layer have different refractive indexes.

8. The organic light emitting display of claim 4, wherein the reflection reduction layer includes a metal layer and an insulating layer.

9. The organic light emitting display of claim 4, wherein the reflection reduction layer includes a metal layer and a metal oxide layer.

10. The organic light emitting display of claim 1, wherein the transistor electrode having the first layer and the second layer is a transistor gate electrode.

11. The organic light emitting display of claim 1, wherein the transistor electrode having the first layer and the second layer is one of a transistor drain electrode or a transistor source electrode.

12. An organic light emitting display comprising:
a substrate; and
a plurality of sub-pixels, each sub-pixel having:
a first area for light emission;
a second area including a data line having a first layer and a second layer between the first layer and the substrate, the second area being different than the first area; and
wherein the second layer of the data line is a reflection reduction layer having lower light reflectability than the first layer a material of the data line.

13. The organic light emitting display of claim 12, wherein the first layer and the second layer of the data line have a same patterned shape.

14. The organic light emitting display of claim 12, wherein the reflection reduction layer includes N layers, where N is an integer equal to or greater than 2.

15. The organic light emitting display of claim 14, wherein the reflection reduction layer includes a layer formed of a reflection reduction material and a layer formed of an insulating material.

16. The organic light emitting display of claim 14, wherein each of the reflection reduction layers is formed of reflection reduction material.

17. The organic light emitting display of claim 14, wherein the layers included in the reflection reduction layer have different refractive indexes.

18. The organic light emitting display of claim 14, wherein the reflection reduction layer includes a metal layer and an insulating layer.

19. The organic light emitting display of claim 14, wherein the reflection reduction layer includes a metal layer and a metal oxide layer.

* * * * *